(12) United States Patent
Wu

(10) Patent No.: US 6,838,949 B2
(45) Date of Patent: Jan. 4, 2005

(54) VOLTAGE CONTROL OSCILLATOR AND MANUFACTURING METHOD THEREOF

(75) Inventor: Yuan-Chung Wu, Hsinchu (TW)

(73) Assignee: Delta Electronics, Inc. (TW)

( * ) Notice: Subject to any disclaimer, the term of this patent is extended or adjusted under 35 U.S.C. 154(b) by 128 days.

(21) Appl. No.: 10/384,521

(22) Filed: Mar. 11, 2003

(65) Prior Publication Data

US 2004/0104779 A1 Jun. 3, 2004

(30) Foreign Application Priority Data

Dec. 3, 2002 (TW) .................................. 91135104 A

(51) Int. Cl.$^7$ ................................................ H03B 1/00

(52) U.S. Cl. ............................. 331/108 D; 331/177 R

(58) Field of Search ...................... 331/68, 69, 108 D, 331/177 R, 187

(56) References Cited

U.S. PATENT DOCUMENTS 4,375,041 A * 2/1983 Aizawa et al. .............. 310/348

* cited by examiner

Primary Examiner—David Mis
(74) Attorney, Agent, or Firm—Hoffman, Wasson & Gitler, P.C.

(57) ABSTRACT

A manufacturing method of voltage control oscillator (VCO) has the following steps. Firstly, a baseboard having an opening is provided. Then, an adjustable electronic device is installed on the baseboard, and an adjustable area of the adjustable device faces the opening of the baseboard. Also, a set of elements including a cover is installed on the baseboard. Then, the adjustable area of the adjustable electronic device is adjusted through the opening of the baseboard. Finally, the baseboard, the adjustable electronic device, and the set of elements make up one adjusted voltage control oscillator. The adjusted voltage control oscillator is then installed on another circuit board, and the surface of the circuit board and the opening form a sheltering space for the adjustable area of the adjustable electronic device.

20 Claims, 6 Drawing Sheets

VOLTAGE CONTROL OSCILLATOR AND MANUFACTURING METHOD THEREOF

BACKGROUND OF THE INVENTION

1. Field of Invention

The present invention relates to a voltage control oscillator and manufacturing method thereof. More particularly, the present invention relates to a voltage control oscillator which utilizes adjustable capacitors and manufacturing method thereof.

2. Description of Related Art

In the field of electronic circuitry, work frequency of radio frequency (R.F.) is widely used in various circuits. In digital circuits, work frequency is used to coordinate different elements for achieving a predetermined task together. In analog circuits, work frequency is used to modulate or demodulate different signals for performing specific functions. Therefore, elements and circuits for generating work frequency are particularly important in circuit design.

There are various types of elements and circuits generate work frequency. One common type of such elements is a voltage control oscillator (VCO), which utilizes an external input voltage to determine and generate an output work frequency. A detailed description of a VCO including various circuit design methods can be found in the book "CMOS", published by IEEE, 1998.

Recently, a new type of passive element, a laser trimmable capacitor, has been designed and manufactured. As shown in FIG. 1, a trimmable capacitor 10 has a trimmable area 101, and the capacitance of the laser trimmable capacitor 10 is adjusted when a laser beam is incident on several portions 1011 of the trimmable area 101. With the accuracy characteristic of lasers, the size and position of these portions 1011 can be accurately produced and the capacitance of the laser trimmable capacitor therefore can be adjusted accurately.

This kind of laser trimmable capacitors is now used in VCOs. These trimmable capacitors are connected to other circuit components of a VCO to generate a work frequency. The specification of the work frequency is therefore adjustable by burning these trimmable capacitors with a laser beam during VCO manufacturing so that a desired specification of work frequency is obtained.

However, metal covers for covering the laser trimmable capacitors and other components need to be soldered after the aforementioned frequency adjustment is done. Even if the laser beam is so accurate that the frequency adjustment is also accurate, metal covers and solders thereon randomly affect the work frequency. It is difficult to estimate the effect of the metal covers and solders thereon because the soldering process is not accurate. The problem becomes more serious when a high work frequency is needed.

More and more products in wireless communication and high speed calculation need a high work frequency. Therefore, it is very important to manufacture a voltage control oscillator with an accurate work frequency adjustment.

SUMMARY OF THE INVENTION

The present invention is directed to a manufacturing method that satisfies this need of an accurate frequency adjustment. The manufacturing method utilizes adjustable electronic devices such as laser trimmable capacitors for accurately adjusting VCOs.

The manufacturing method according to the present invention includes the following steps. Firstly, a base board is provided and an opening is formed on the base board. Next, an adjustable electronic device is installed on one side of the base board, and an adjustable area of the adjustable electronic device faces the opening. A set of VCO components is also installed on the base board. The set of VCO components includes a frequency generating circuit and shelter. The frequency generating circuit is connected to the adjustable electronic device and generates a work frequency according to a characteristic of the adjustable electronic device.

Next, the adjustable area of the adjustable electronic device is adjusted through the opening from another side of the base board. The adjusted VCO is then installed on another circuit board of an electronic apparatus. A portion of the surface of the circuit board and the borders of the opening of the base board together form a sheltering space for sheltering the adjustable area of the adjustable electronic device so that mist or other factors do not interfere with the adjustable area.

The present invention has at least the following advantages. Firstly, the present invention utilizes an adjustable electronic device, e.g., the laser trimmable capacitor, in VCO design, and such a VCO can therefore be finely tuned. Secondly, the adjustment of the adjustable electronic device is adjusted after the shelter, e.g., a metal cover, is installed, and the problem of calculating an indeterminable effect of the shelter is avoided. Thirdly, when the oscillator is installed on another circuit board for a specific application, the circuit board and the borders of the aforementioned opening together form a shelter space for sheltering the adjustable area of the adjustable electronic device so that mist or other factors do not interfere with the adjustable area.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

The present invention provides a VCO and related manufacturing method thereof. In addition, an electronic apparatus using the VCO and related manufacturing method thereof is also disclosed. The concept of the present invention is explained in detail by disclosing several embodiments as follows.

Figure 2A:
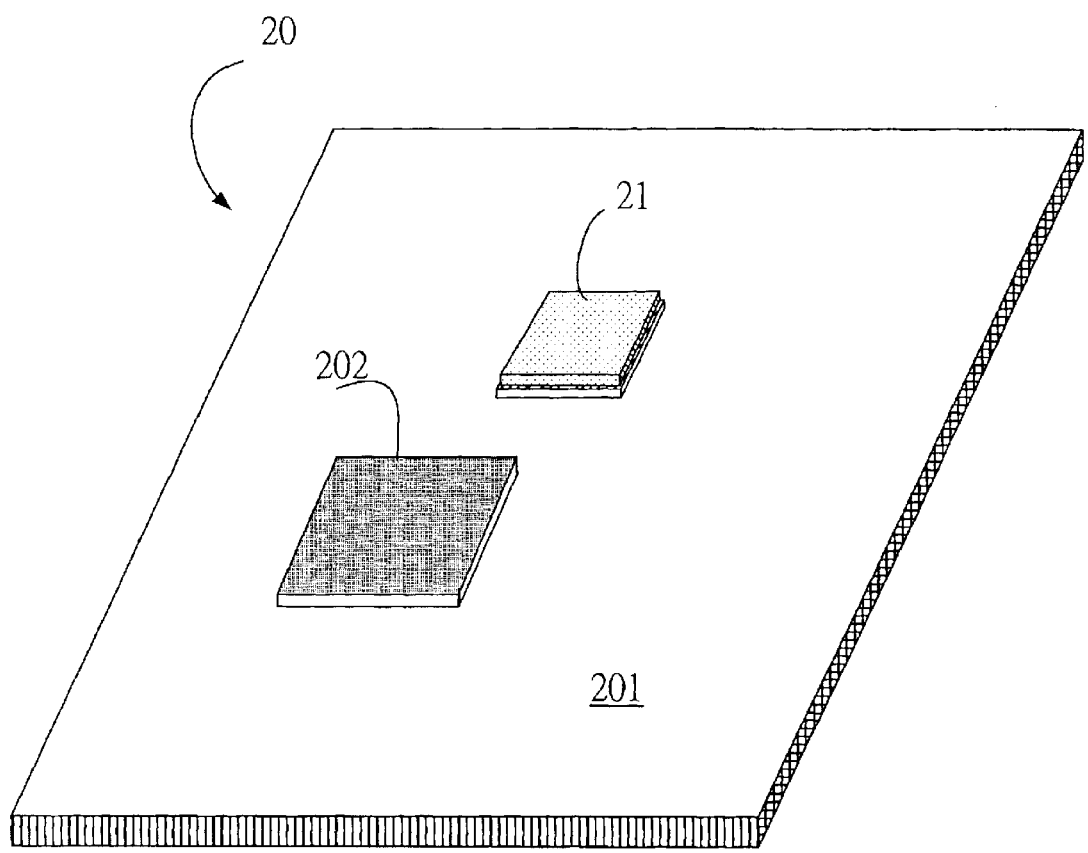
FIG. 2(a) is a schematic diagram of a circuit board according to an embodiment of the invention.

Please refer to FIG. 2(a). FIG. 2(a) is a schematic diagram of a circuit board 20. The circuit board 20 is installed in an electronic apparatus which needs a work frequency. Examples of the electronic apparatus include mobile phones, wire or wireless communication products, and various signals processing processors, etc.

Figure 2B:
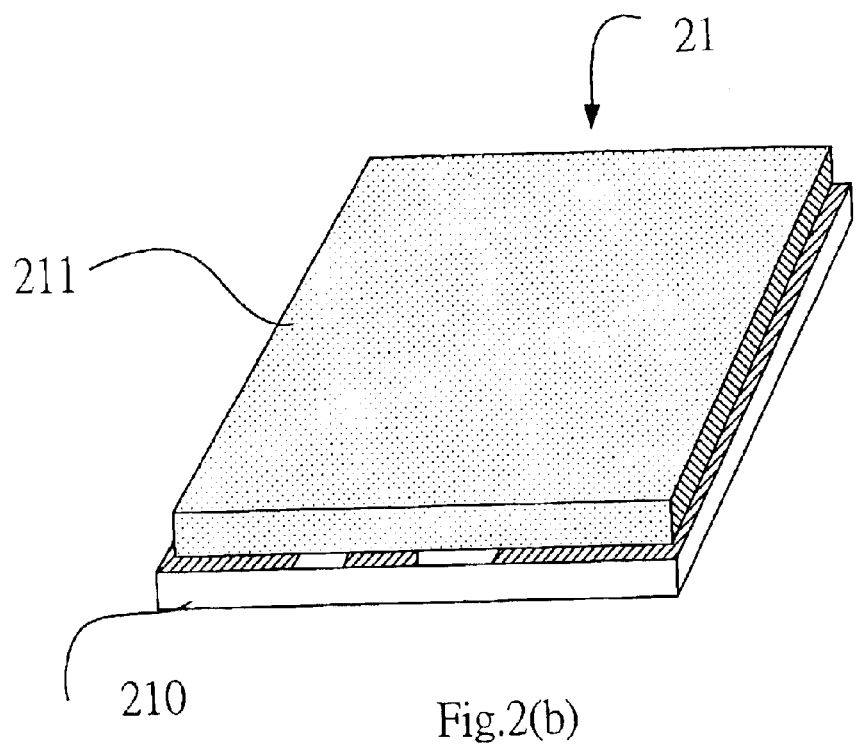
FIG. 2(b) is a schematic diagram of a voltage control oscillator according to the embodiment of the invention.
Figure 2C:
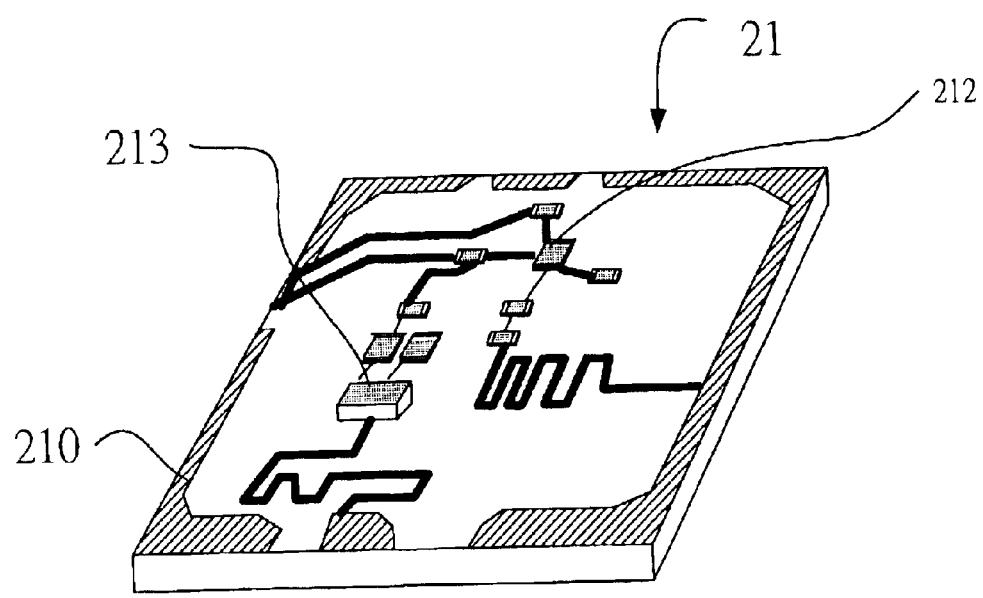
FIG. 2(c) is a schematic diagram of a portion of the components of the voltage control oscillator according to the embodiment of the invention.

The circuit board 20 has a first base board 201, a set of working circuits 202, and at least one VCO 21. The set of working circuits 202 is connected to the VCO 21 and is installed on the first base board 201. Also, the set of working circuits 202 provides a predetermined voltage to the VCO 21 for acquiring a desired work frequency generated by the VCO 21. Please refer to FIG. 2(b) and FIG. 2(c). FIG. 2(b) and FIG. 2(c) are magnified diagrams of the voltage oscillator 21. As shown in FIG. 2(b), the VCO 20 has a second base board 210, and there is one shelter 211 on the second base board 210. FIG. 2(c) provides a schematic depiction of components inside the shelter 211. At least one adjustable electronic device 212 and a frequency generating circuit 213 are located on the second base board 210. The adjustable electronic device 212 is electrically connected to the frequency generating circuit 213 and the frequency generating circuit 213 generates a work frequency according to a characteristic of the adjustable electronic device 212. The frequency generating circuit 213 and the shelter 211 are components of the VCO 21. The frequency generating circuit 213 is a circuit that generates an output voltage according to an external input voltage, and detailed methods for implementing such circuit can be found in books discussing VCOs according to prior art.

Figure 1:
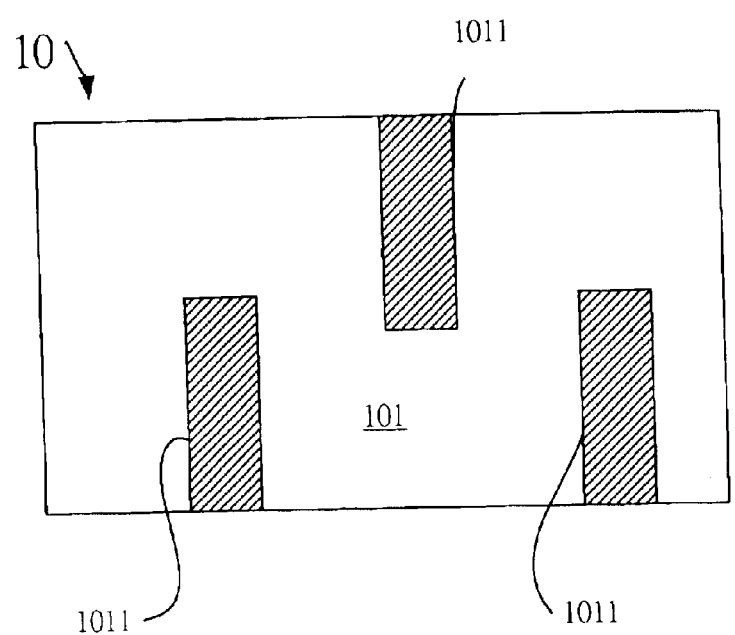
FIG. 1 is a schematic diagram for a laser trimmable capacitor according to prior art.

In addition, the adjustable electronic device 212 has an adjustable area (not shown) for changing the characteristic of the adjustable electronic device 212 and then determining the work frequency generated by the frequency generating circuit 213. An example of the adjustable electronic device 212 includes the aforementioned laser trimmable capacitor as shown in FIG. 1. In the example of the laser trimmable capacitor, a trimmable area is the adjustable area of the laser trimmable capacitor. A laser beam can be utilized for adjusting the adjustable area of the laser trimmable capacitor so that the capacitance of the laser trimmable capacitor is adjusted and then the work frequency of the voltage control oscillator is finely tuned.

Further, there is an opening (not shown) in the second base board 210, and the adjustable area (not shown) of the adjustable electronic device 212 faces the opening. Before the VCO 21 is installed on the first base board 201, the adjustable area is adjusted through the opening from another side of the second base board 210 so that the characteristic of the adjustable electronic device 21 is finely tuned. Then, the VCO 21 is installed on the first base board 201 and a portion of the surface of the first base board 201 and the borders of the opening together form a shelter space for sheltering the adjustable area of the adjustable electronic device 212.

Figure 3:
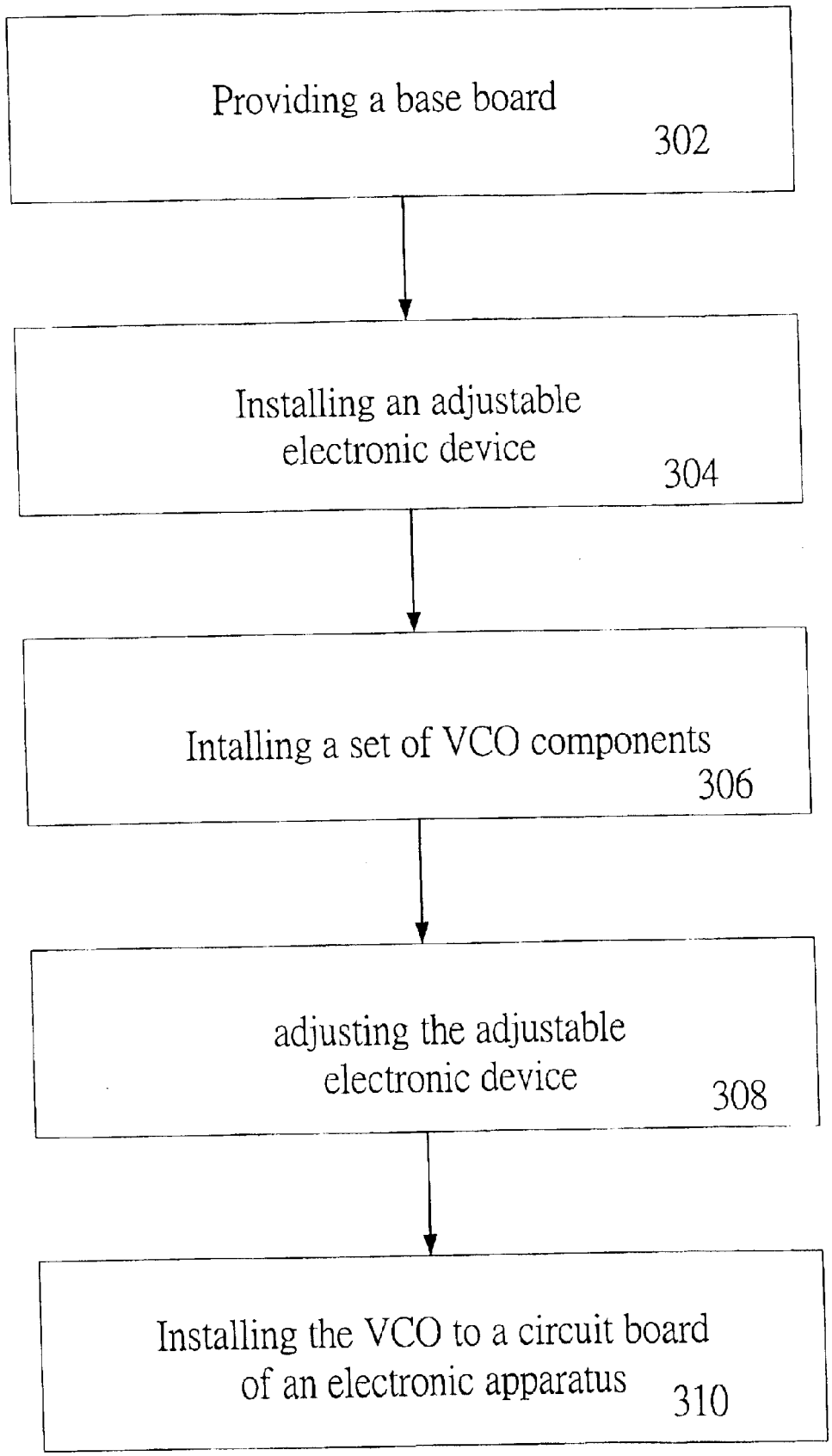
FIG. 3 is a flowchart for manufacturing the embodiment of the invention.

FIG. 3 and FIGS. 4(a) to 4(d) introduce the manufacturing method of the aforementioned apparatus and the relationship between the opening of the second base board 212, the adjustable area of the adjustable electronic device 212, and the first base board 201. FIG. 3 is a schematic flowchart for manufacturing the VCO and utilizing the same, and FIGS. 4(a) to 4(d) are cross-sectional diagrams of the VCO and the electronic apparatus in different manufacturing steps.

Figure 4A:
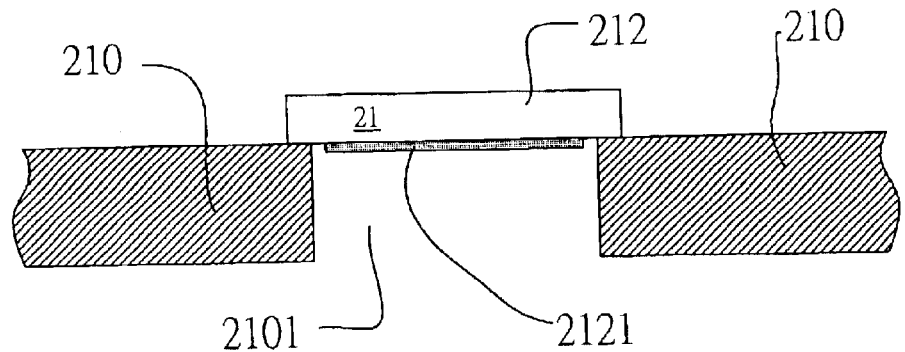
FIGS. 4(a) to 4(d) are schematic diagrams of steps for installing the embodiment of this invention.

Firstly, a second base board 210 of the VCO 21 is provided (step 302), and an opening 2101 is formed in the second base board 210. Next, an adjustable electronic device 212 is installed on the second base board 210 (step 304), and the adjustable area 2121 of the adjustable electronic device 212 faces the opening 2101 of the second base board 210. FIG. 4(a) schematically depicts the structure after the above manufacturing steps.

Figure 4B:
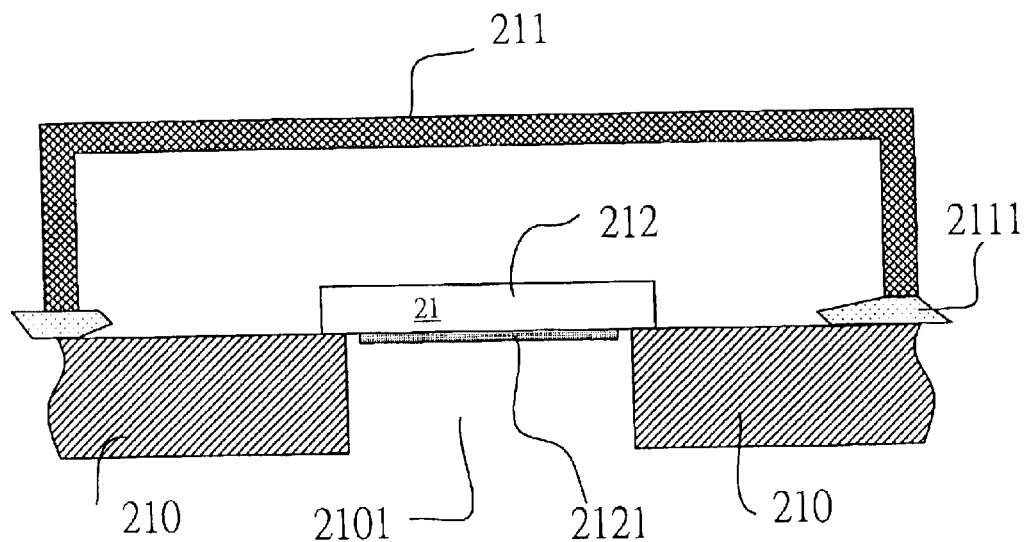

In addition to the adjustable electronic device 212, a set of VCO components is installed on the second base board 210 (step 306). The set of VCO components includes a frequency generating circuit (not shown), and a shelter 211 for sheltering the frequency generating circuit. An example of the shelter 211 is a metal cover, and the installation method of the metal cover includes soldering the metal cover using solders 2111 to the second base board 210. FIG. 4(b) schematically depicts the structure after the above manufacturing steps.

Figure 4C:
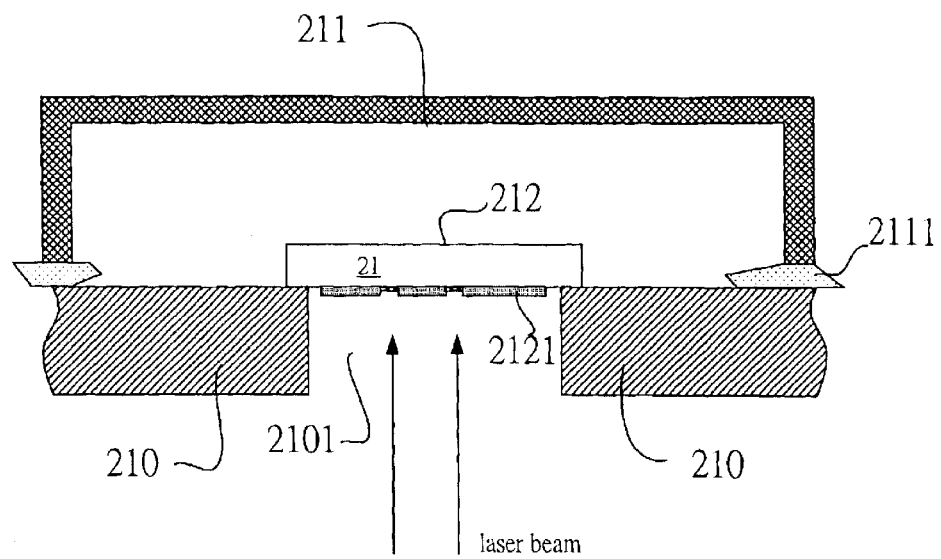

Next, the adjustable area 2121 is adjusted through the opening 2101 of the second base board 210 from another side of the second base board 210 opposite the side for installing the adjustable electronic device 212 (step 308), as shown in FIG. 4(c). Therefore, the work frequency generated by the VCO 21 satisfies required specifications. In the case that the adjustable electronic device 212 is a laser trimmable capacitor, a laser beam burns the adjustable area 2121 through the opening 2101 so that the capacitance of the laser trimmable capacitor is adjusted.

Figure 4D:
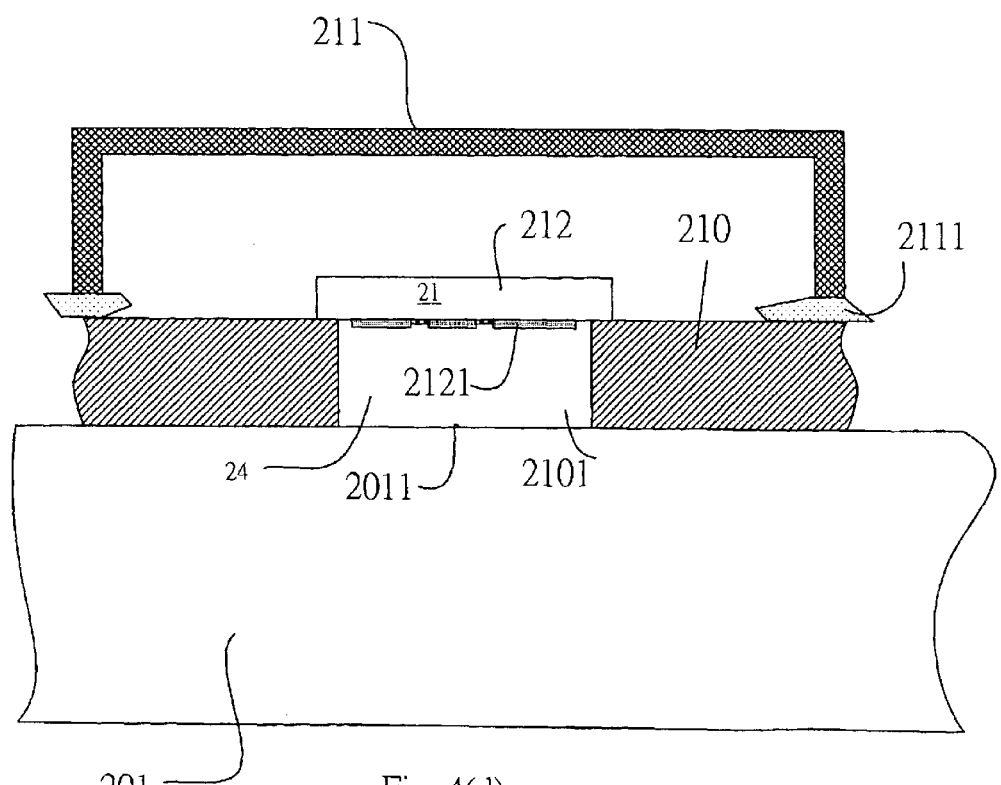

The adjusted voltage control oscillator 21 is then installed on the first base board 201 (step 310), as shown in FIG. 4(d). The first base board 201 is utilized for installing a set of working circuits and the first base board 201 is installed in an electronic apparatus. A portion of surface 2011 of the first base board 201 and the opening 2101 of the second base board 210 together form a sheltering space 24 for sheltering the adjustable area 2121 of the adjustable electronic device 212.

The present invention has at least the following advantages. Firstly, the present invention utilizes an adjustable electronic device, e.g., a laser trimmable capacitor, in a voltage control oscillator, and the voltage control oscillator can therefore be finely tuned. Secondly, the adjustable electronic device is adjusted after the shelter, e.g., a metal cover, is installed, and the problem of calculating an indeterminable effect of the shelter is avoided. Thirdly, when the oscillator is installed on another circuit board for a specific application, the circuit board and the borders of the aforementioned opening together form a shelter space for sheltering the adjustable area of the adjustable electronic device so that mist or other factors do not interfere with the adjustable area.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a voltage control oscillator (VCO), the method comprising:
    providing a base board having an opening;
    installing an adjustable electronic device on a first side of said base board wherein said adjustable electronic device has an adjustable area facing said opening;
    installing a set of VCO components on said first side of said base board wherein said set of VCO components comprises a frequency generating circuit connected to said adjustable electronic device, and said frequency generating circuit generates a work frequency according to a characteristic of said adjustable electronic device; and adjusting said adjustable area of said adjustable electronic device though said opening from a second side for adjusting said characteristic of said adjustable electronic device.

2. The method of claim 1, wherein said set of VCO components further comprises a shelter for sheltering said frequency generating circuit.

3. The method of claim 2, wherein said shelter is a metal cover.

4. The method of claim 1, wherein said adjustable electronic device is a laser adjustable capacitor, and said characteristic of said adjustable electronic device is a capacitance of said laser adjustable capacitor.

5. The method of claim 4, wherein the step of adjusting adjustable area of said laser adjustable capacitor is to burn said laser adjustable capacitor with a laser for adjusting the capacitance of said laser adjustable capacitor.

6. A VCO comprising:
   a base board having an opening;
   an adjustable electronic device installed on a first side of said base board, wherein said adjustable electronic device has an adjustable area facing said opening of said base board, and said adjustable area is utilized for adjusting a characteristic of said adjustable electronic device; and
   a set of VCO components installed on said first side of base board, wherein said set of VCO components comprises a frequency generating circuit connected to said adjustable electronic device, and said frequency generating circuit generates a work frequency according to said characteristic of said adjustable electronic device;
   wherein said adjustable area of said adjustable electronic device is adjusted through said opening from a second side of said base board.

7. The VCO of claim 6, wherein said set of VCO components comprises a shelter for sheltering said frequency generating circuit.

8. The VCO of claim 7, wherein said shelter is a metal cover.

9. The VCO of claim 6, wherein said adjustable electronic device is a laser adjustable capacitor and said characteristic of said electronic device is a capacitance of said laser adjustable capacitor.

10. The VCO of claim 9, wherein a laser beam is used to burn said adjustable area of said laser adjustable capacitor to adjust the capacitance of said laser adjustable capacitor.

11. A method for manufacturing an electronic apparatus, said method utilizing a work frequency, said method comprising:
   providing a first base board;
   installing a VCO on said first base board, wherein said VCO comprises a second base board, an adjustable electronic device, and a set of VCOs, wherein said adjustable electronic device and said set of VCO components are installed on a first side of said second base board, a second side of said second base board faces said first base board, said second base board has an opening and said adjustable electronic device has an adjustable area facing said opening, said adjustable area of said adjustable electronic device is utilized for adjusting a characteristic of said adjustable electronic device, said set of VCO components comprises a frequency generating circuit connected to said adjustable electronic device, and said frequency generating circuit generates a work frequency according to said characteristic of said adjustable electronic device;
   adjusting said characteristic of said adjustable electronic device; and
   installing a set of working circuits on said first base board, wherein said set of working circuits connects to said VCO and utilizes said VCO.

12. The method of claim 11, wherein said set of VCO components comprises a shelter for sheltering said frequency generating circuit.

13. The method of claim 12, wherein said shelter is a metal cover.

14. The method of claim 11, wherein said adjustable electronic device is a laser adjustable capacitor, and said characteristic of said electronic device is a capacitance of said laser adjustable capacitor.

15. The method of claim 14, wherein the step of adjusting said characteristic of said adjustable electronic device is to use a laser beam to burn said adjustable area of said laser adjustable capacitor for adjusting the capacitance of said laser adjustable capacitor.

16. An electronic apparatus which utilizes a work frequency, said electronic apparatus comprising:
   a first base board;
   a VCO installed on said first base board, wherein said VCO comprises:
      a second base board having an opening;
      an adjustable electronic device installed on a first side of said second base board wherein said second side of said second base board faces said first base board, said adjustable electronic device has an adjustable area for adjusting a characteristic of said adjustable electronic device, said adjustable area faces said opening, and a portion of surface of said first base and boarders of said opening together define a shelter space for sheltering said adjustable area of said adjustable electronic device; and
      a set of VCO components installed on said first side of said second base board, wherein said set of VCO components comprises a frequency generating circuit connected to said adjustable electronic device and said frequency generating circuit generates a work frequency according to said characteristic of said adjustable electronic device; and
   a set of working circuits installed on said first base board wherein said set of working circuits is connected to and utilize said VCO.

17. The electronic apparatus of claim 16, wherein said set of VCO components further comprises a shelter for sheltering said frequency generating circuit.

18. The electronic apparatus of claim 17, wherein said shelter is a metal cover.

19. The electronic apparatus of claim 16, wherein said adjustable electronic device is a laser adjustable capacitor and said characteristic of said electronic device is a capacitance of said laser adjustable capacitor.

20. The electronic apparatus of claim 19, wherein a laser beam is used to burn said adjustable area of said laser adjustable capacitor to adjust the capacitance of said laser adjustable capacitor.

* * * * *